United States Patent
Minemura et al.

(10) Patent No.: US 6,444,483 B1
(45) Date of Patent: Sep. 3, 2002

(54) METHOD AND APPARATUS OF PRODUCING PARTIAL-AREA MASK DATA FILES

(75) Inventors: Masahiko Minemura; Tomoyuki Okada; Ryo Tsujimura; Kenji Kikuchi; Yoshimasa Iiduka, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/617,044

(22) Filed: Jul. 14, 2000

(30) Foreign Application Priority Data

Aug. 24, 1999 (JP) .......................................... 11-236301

(51) Int. Cl.[7] .............................................. H01L 21/00
(52) U.S. Cl. ................. 438/24; 438/5; 438/48; 257/48; 700/121; 716/19; 345/853
(58) Field of Search ................. 384/24, 5, 48; 257/48; 700/121; 716/19; 345/853; 364/468.28

(56) References Cited

U.S. PATENT DOCUMENTS 5,694,325 A * 12/1997 Fukuda et al. ......... 364/468.28

* cited by examiner

Primary Examiner—Wael Fahmy
Assistant Examiner—Hsien-Ming Lee
(74) Attorney, Agent, or Firm—Staas & Halsey, LLP

(57) ABSTRACT

A full area of a semiconductor integrated circuit is divided into unit areas, a mask data file for use in a beam exposure system or an inspection apparatus is produced based on CAD data of the full area, full-area header information in which a starting address of a mask data of each unit area relates to positional information on said unit area, partial-area header information corresponding to each of partial areas obtained by division of the full area is produced based on the full-area header information and mask data of the partial areas are extracted from a mask data of the full area based on the partial area header information to produce the mask data files corresponding to the partial area header information.

5 Claims, 11 Drawing Sheets

| ADDRESS | SUB-AREA NO. | REAL DATA |
|---|---|---|
| 0000 | 1 | E111, E112, ··· |
|  | 2 | E121, E122, ··· |
|  | 3 | E131, E132, ··· |
|  | ⋮ | ⋮ |
|  | 6 | E161, E162, ··· |
| 0A00 | 3 | E231, E232, ··· |
|  | 4 | E241, E242, ··· |
|  | 5 | E251, E252, ··· |
|  | 6 | E261, E262, ··· |
| 0B01 | 3 | E331, E332, ··· |
|  | 4 | E341, E342, ··· |
|  | 5 | E351, E352, ··· |
|  | 6 | E361, E362, ··· |
| 0F01 | 5 | E451, E452, ··· |
|  | 6 | E461, E462, ··· |

FIG.5

| ADDRESS | SUB-AREA NO. | REAL DATA | |
|---|---|---|---|
| | | | ~19A |
| 0000 | 1 | E111, E112, ··· | |
| | 2 | E121, E122, ··· | |
| | 3 | E131, E132, ··· | |
| | ⋮ | ⋮ | |
| | 6 | E161, E162, ··· | |
| 0A00 | 3 | E231, E232, ··· | |
| | 4 | E241, E242, ··· | |
| | 5 | E251, E252, ··· | |
| | 6 | E261, E262, ··· | |

| ADDRESS | SUB-AREA NO. | REAL DATA | |
|---|---|---|---|
| | | | ~19B |
| 0000 | 3 | E331, E332, ··· | |
| | 4 | E341, E342, ··· | |
| | 5 | E351, E352, ··· | |
| | 6 | E361, E362, ··· | |
| 0300 | 5 | E451, E452, ··· | |
| | 6 | E461, E462, ··· | |

FIG.7(A)

| FILE | CPU TIME (MIN) | OUTPUT DATA AMOUNT (MB) |
|---|---|---|
| FULL AREA | 56 | 52.8 |
| A | 2 | 12.2 |
| B | | 12.6 |
| C | | 12.8 |
| D | | 15.2 |
| SUM | 58 | |

FIG.7(B)

| FILE | CPU TIME (MIN) | OUTPUT DATA AMOUNT (MB) |
|---|---|---|
| A | 35 | 12.2 |
| B | 34 | 13.7 |
| C | 34 | 13.9 |
| D | 35 | 12.9 |
| SUM | 138 | |

METHOD AND APPARATUS OF PRODUCING PARTIAL-AREA MASK DATA FILES

BACKGROUND OF THE INVENTION

1. Field of the Invention

The present invention relates to a method and an apparatus of effectively producing mask data files of partial areas for use in a charged particle beam exposure system or/and an inspection apparatus, based on a CAD data file of a semiconductor integrated circuit, and relates to a recording medium on which a program for executing this method is stored.

2. Description of the Related Art

Figure 9:
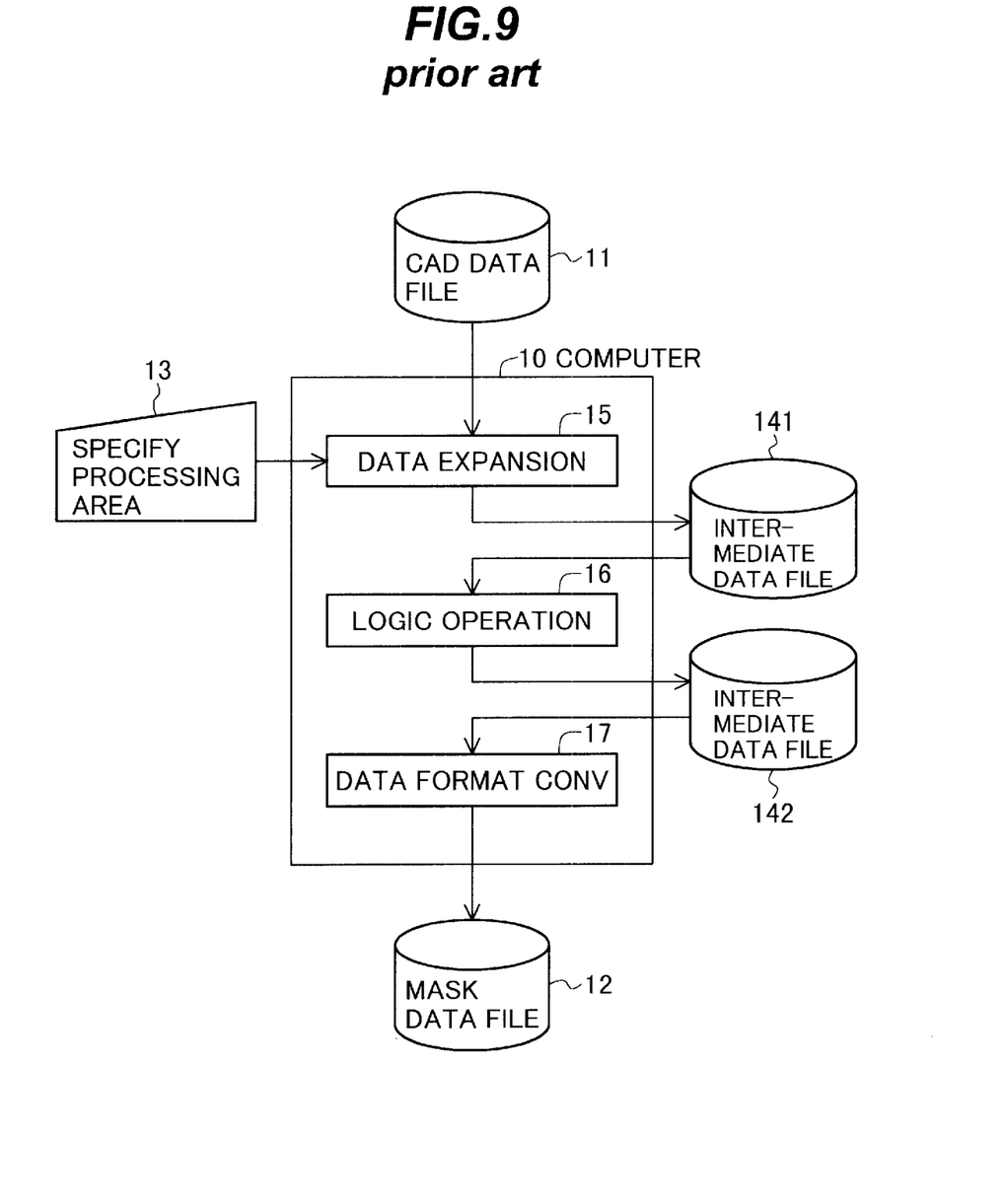
FIG. 9 is a schematic functional block diagram showing a prior art apparatus of producing mask data files of partial areas.

FIG. 9 shows a schematic functional block diagram of a prior art apparatus for producing mask data files 12 of partial areas based on a CAD data file 11 by a computer 10, the file 12 being for use in a charged particle beam exposure system or/and an inspection apparatus.

In the CAD data file 11, design data covering al the area of a semiconductor chip are stored. With increase in degree of integration and multi-function of LSI, their circuits have been enlarging and data amount in the CAD data file 11 also have been increasing. A data amount further increases when the mask data file 12 is produced, which demands division of the mask data file 12 into a plurality of files if the increase in data amount exceeds an allowable amount on the exposure system side.

Therefore, an area on a chip is specified by an input apparatus 13, and data of the area is read out from the CAD data file 11 into the computer 10 to produce the mask data file 12, which processing is repeatedly performed. In the course of the repetition of processing by the computer 10, intermediate data files 141 and 142 are produced. The files 11, 12, 141 and 142 are stored on one or more hard disks.

In FIG. 9, a software configuration of the computer 10 is shown with functional blocks, which will be described below.

In a data expansion section 15, the CAD data of the area specified by the input apparatus 13 is read from the file 11, the data with a hierarchical structure is expanded and furthermore disassembled into basic figures decodable by an exposure system or/and an inspection apparatus to produce the intermediate data file 141. In a logic operation section 16, data in the file 141 is read, and logic operation for figures between layers, scaling, sizing and so on are performed and the results are stored into the intermediate data file 142. In a data format conversion section 17, data in the file 142 is read, and converted into a format readable by the exposure system or/and the inspection apparatus to store into the mask data file 12.

Figure 10:
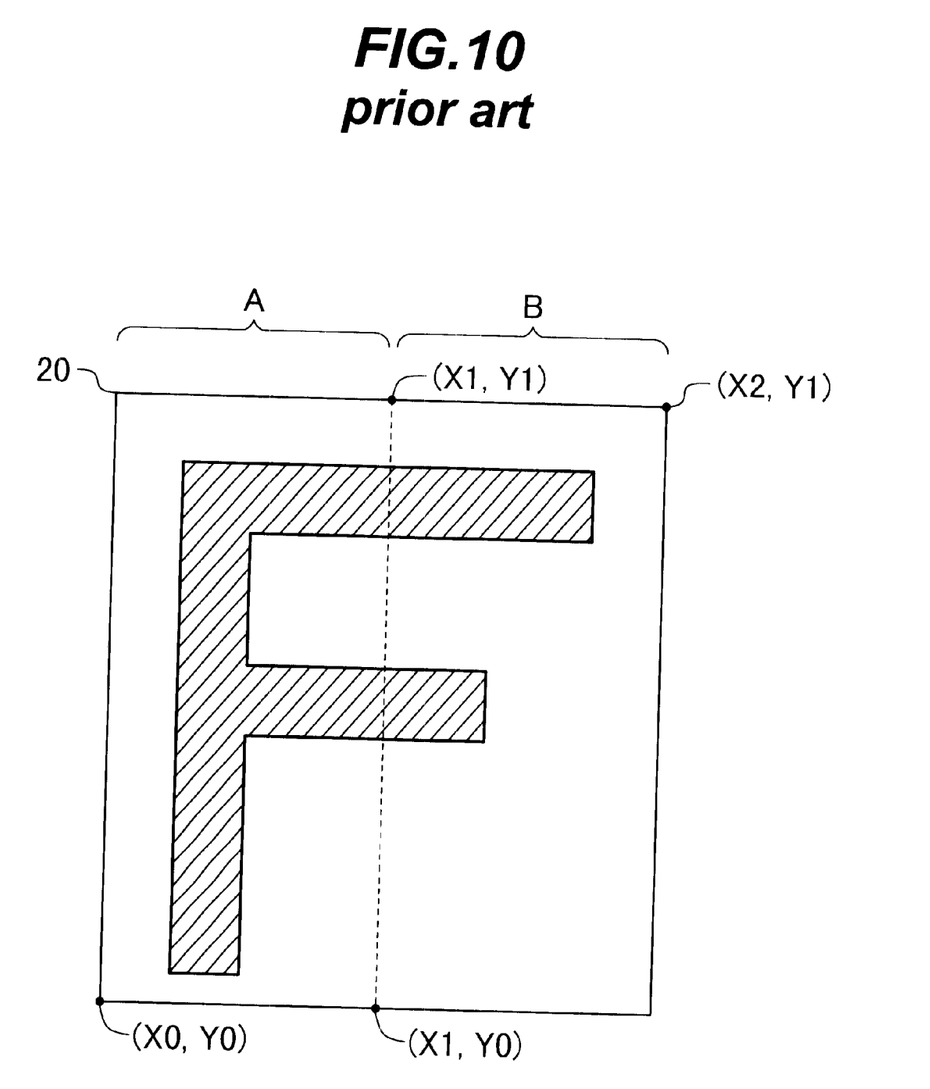
FIG. 10 is a view of a simplified mask pattern of the full area of a semiconductor chip.

FIG. 10 shows a simplified mask pattern of the full area of a semiconductor chip. A hatched portion denotes a through hole pattern. An area specified by the input apparatus 13 is denoted by coordinates of a pair of diagonal points. For example, the full area is denoted as (X0, Y0)-(X2, Y1), wherein (X0, Y0), e.g. (0, 0), are an origin of a coordinate system for the full area 20.

Figure 11A:
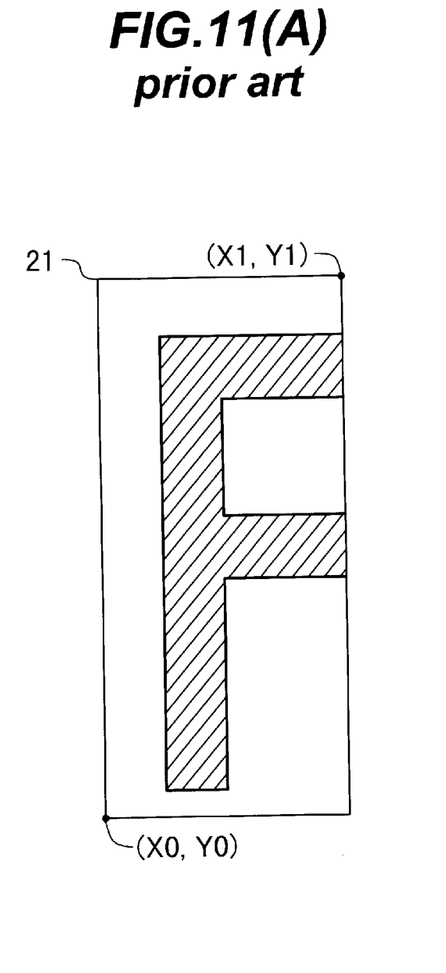
FIGS. 11(A) and 11(B) are illustrations showing mask data files of the partial areas A and B of FIG. 10.
Figure 11B:
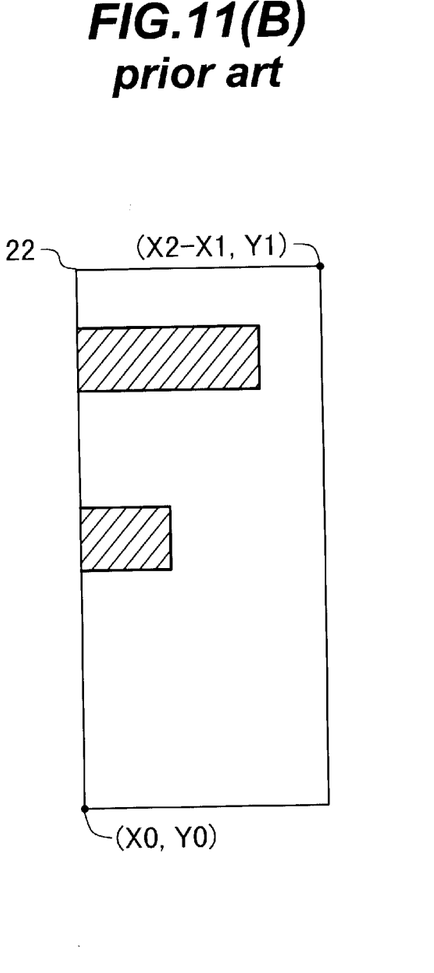

In a case where the full area 20 is divided into two partial areas (X0, Y0)-(X1, Y1) and (X1, Y0)-(X2, Y1) to produce respective mask data files, the images of the mask data are partial areas 21 and 22 as shown in FIGS. 11(A) and 11(B). Origins of coordinate systems for the areas 21 and 22 are both (X0, Y0). Coordinates of the other diagonal point of the area 22 are (X2-X1, Y1).

In the prior art, the full area of a chip was divided into a plurality of partial areas, and each time when a partial area was specified by the input apparatus 13, processings in the data expansion section 15, the logic operation section 16 and the data format conversion section 17 were carried out to produce a mask data file 12, therefore processing of data of the full area cannot be collectively performed in each of the processing sections 15, 16 and 17, resulting in degrading processing efficiency and considerably lengthening the total time of producing the master data files 12 of the areas obtained by the division compared with a time for producing a mask data file with specifying the full area only once by the input apparatus 13.

Furthermore, the full area is firstly specified by the input apparatus 13 to produce the mask data file 12, and if a data amount thereof exceeds an allowable amount, the full area is necessary to be divided into a plurality of partial areas to repeat the above described processing, which makes the above problem remarkable.

SUMMARY OF THE INVENTION

Accordingly, it is an object of the present invention to provide a method and an apparatus of producing mask data files of partial areas with a shorter time in a case where the full area of a semiconductor integrated circuit is divided into a plurality of partial areas to produce the mask data files of the respective areas.

In one aspect of the present invention, there is provided a method of producing partial-area mask data files for use in a charged particle beam exposure system or an inspection apparatus based on a CAD data of a full area of a semiconductor integrated circuit, the partial-area mask data files being of respective partial areas obtained by dividing the full area, the method comprising the steps of: dividing the full area into a plurality of unit areas; producing a full-area mask data file based on the CAD data of the full area, and producing full-area header information having mask top data addresses of respective the unit areas and positional information on the unit areas; producing partial-area header information for each of the partial areas based on the full-area header information; and extracting mask data of each of the partial areas from the full-area mask data file based on the partial-area header information to produce the partial-area mask data file corresponding to the partial-area header information.

With this aspect of the present invention, since a full-area mask data file is produced from CAD data covering the full area of a semiconductor integrated circuit, processing therefore can be collectively carried out and thereby its processing efficiency is improved compared with a case where the full area is firstly divided into the partial areas, and further, the following processing becomes simple, resulting in that the sum of times for producing partial-area mask data files based on the CAD data can be shorter than that of the prior art.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

Figure 1:
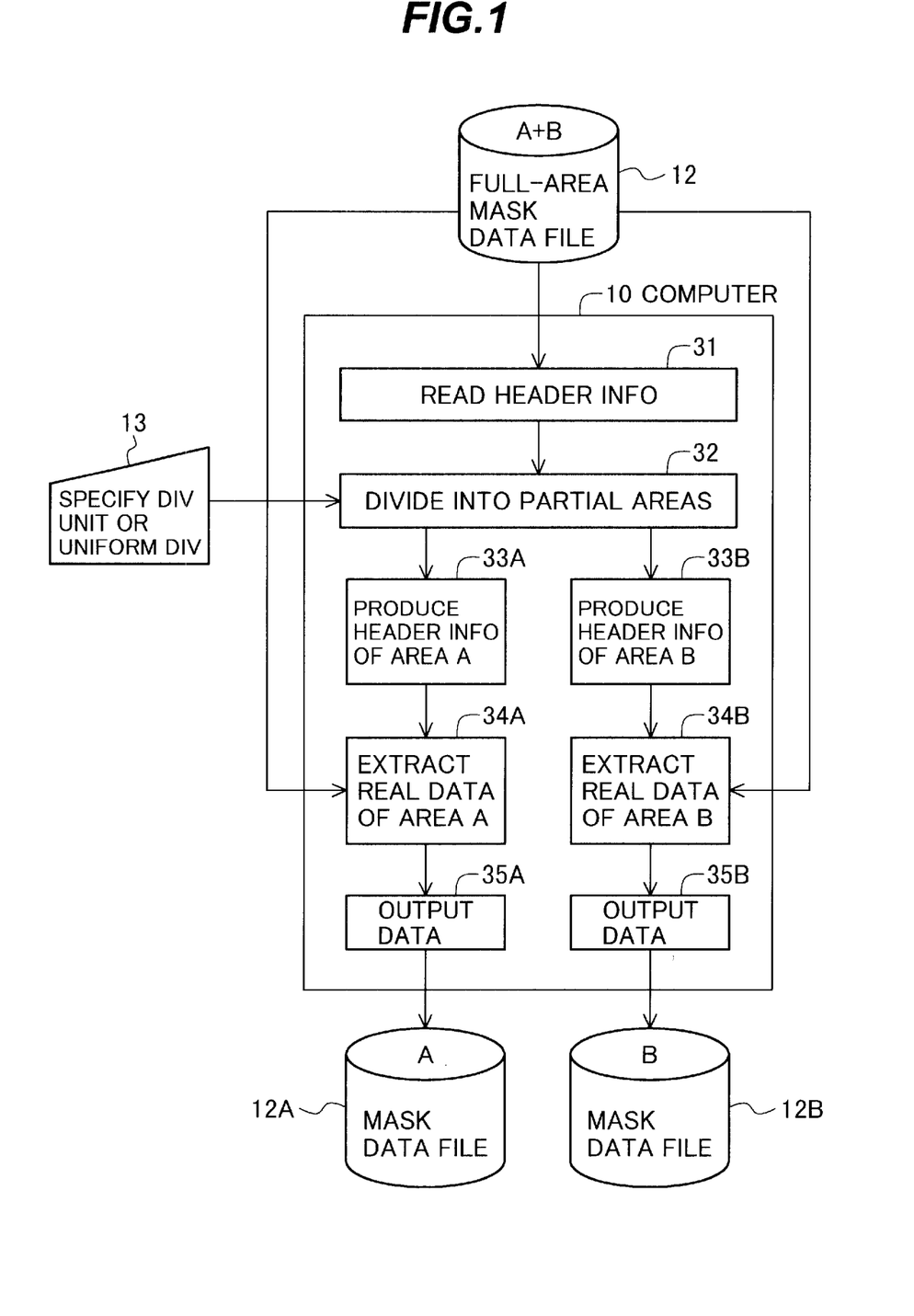
FIG. 1 is a schematic functional block diagram showing an apparatus of producing mask data files of partial areas of an embodiment according to the present invention.

FIG. 1 is a schematic functional block diagram showing an apparatus of producing mask data files of partial areas of an embodiment according to the present invention.

A hardware configuration of the apparatus of FIG. 1 is the same as that of FIG. 9 but there is a difference only in software configuration therebetween.

Firstly, in the configuration of FIG. 9, the full area on a semiconductor chip is specified by the input apparatus 13 and a mask data file 12 is produced based on the CAD data file 11.

Figure 2:
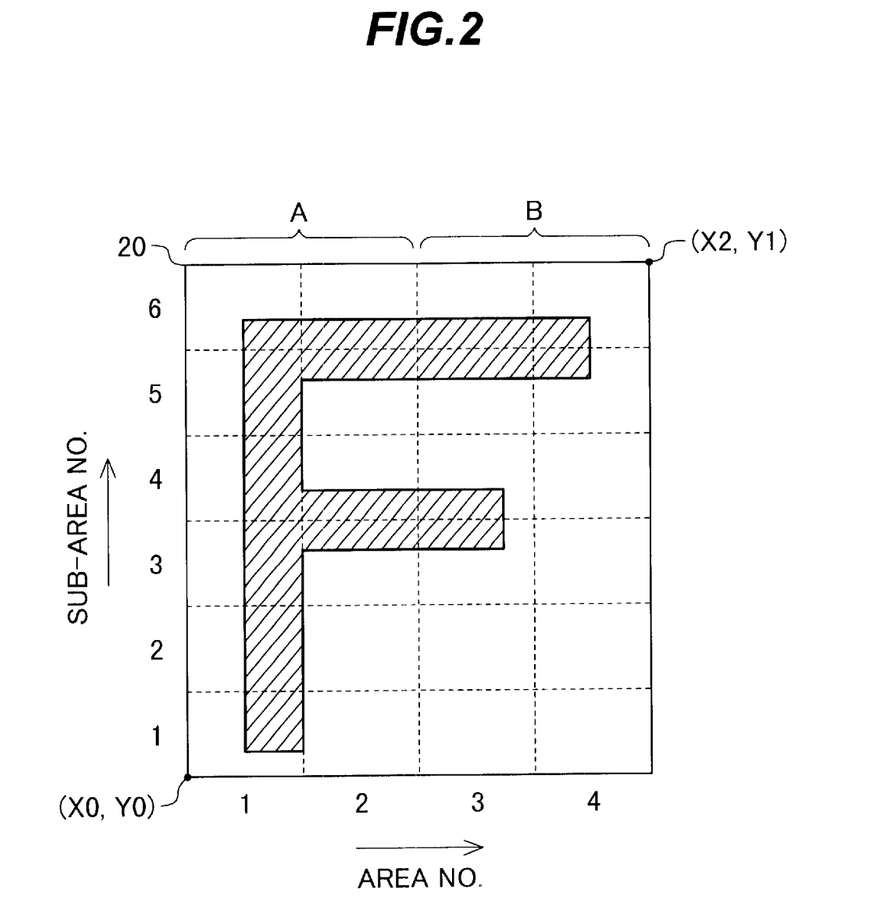
FIG. 2 is an illustration showing division of the full area of a semiconductor chip into unit areas.

By processing in the data format conversion section 17, as shown in FIG. 2, the full area 20 of the semiconductor chip is divided into unit areas as partitioned by dotted lines. Position of each unit area is identified by a pair of an area number on the abscissa and a sub-area number on the ordinate.

Figure 3:
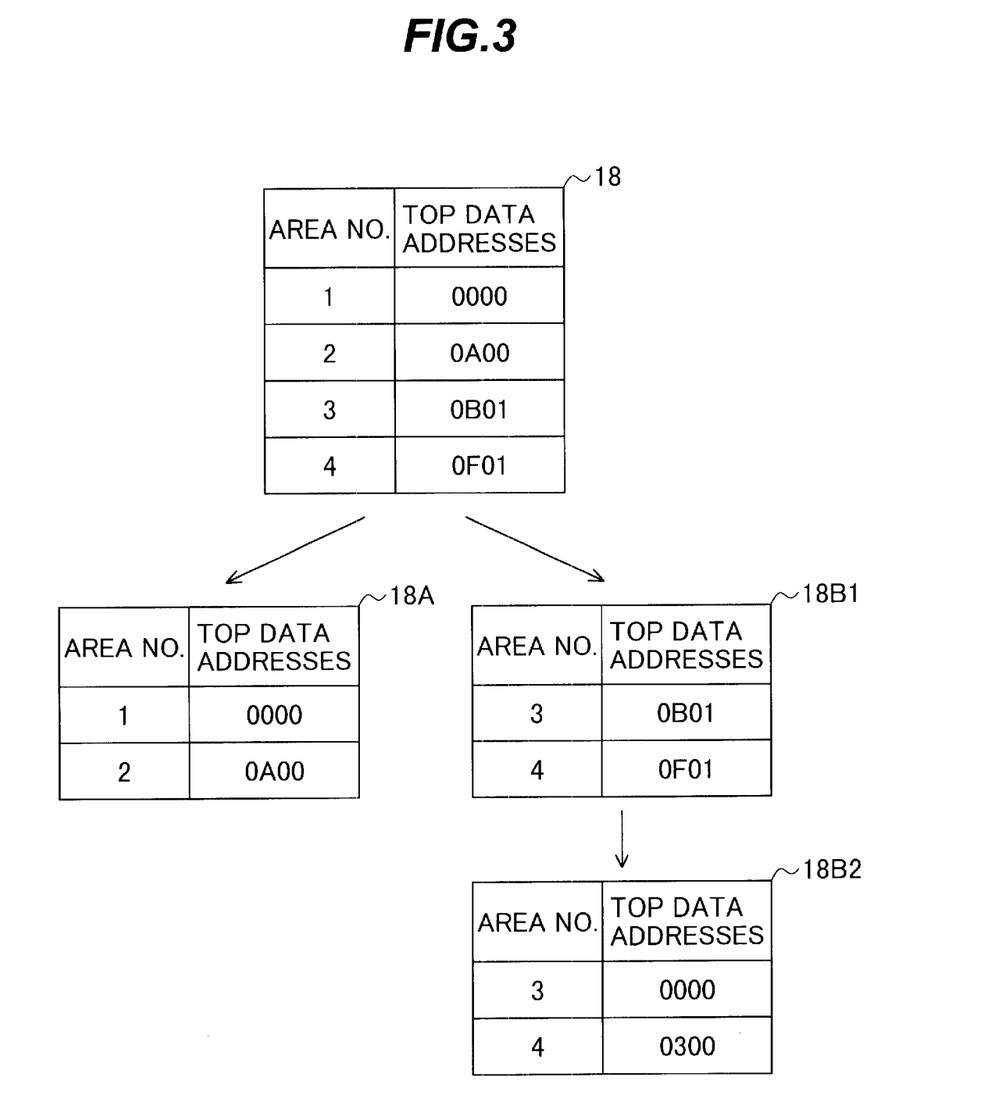
FIG. 3 is an illustration showing header information of the full area and partial areas.
Figure 4:
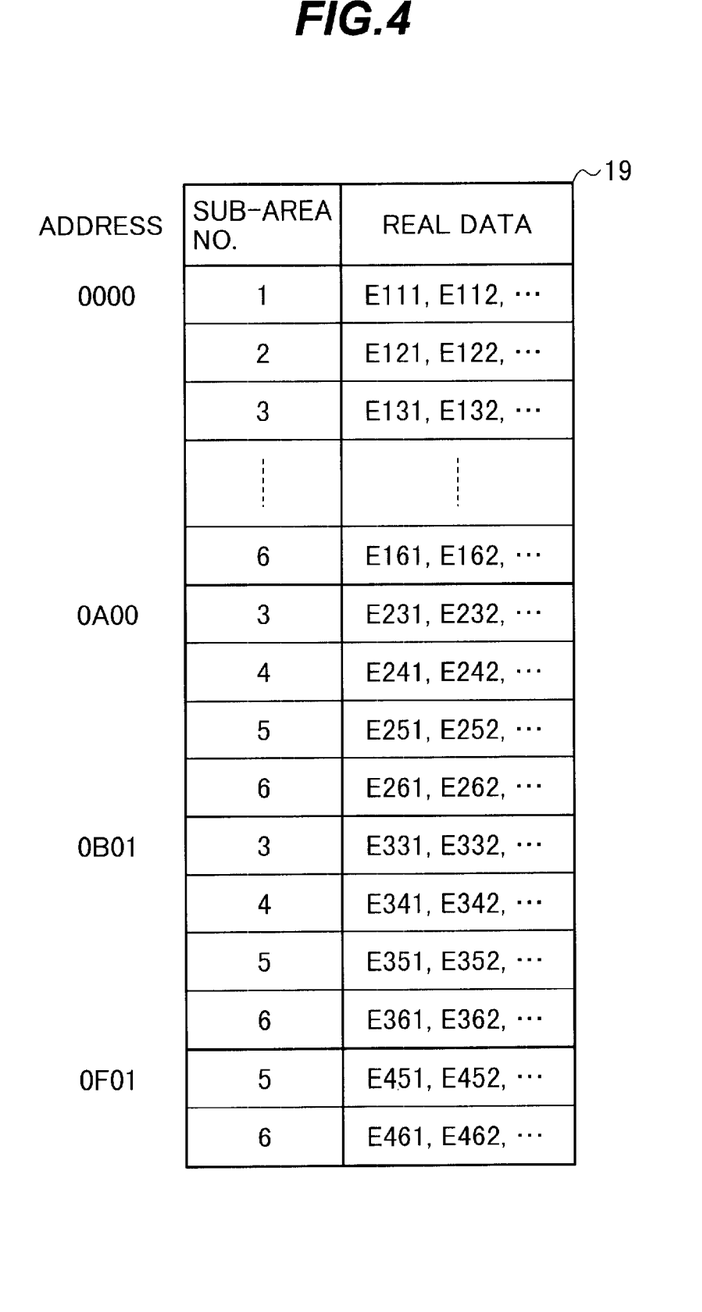
FIG. 4 is an illustration showing real data of the full area.

In the data format conversion section 17 of FIG. 9, combinations of full-area header information 18 shown in FIG. 3 and real data 19 (including a sub-area number) of the full area shown in FIG. 4 are produced as a mask data. The full-area header information 18 is expressed as a table having area numbers and starting addresses of data relating to the respective area numbers in the real data 19 of the full area. The real data 19 of the full area have sub-area numbers, which are sub-headers, and exposure data or/and inspection data (real data) relating to the respective sub-area numbers. For example, 'E241' is the first real data of a sub-area number 4 of an area number 2, and includes an identification code, a size, coordinates of a starting point, an exposure dose of a basic figure.

The mask data file 12 including the full-area header information 18 and the real data 19 of the full area is used as an input data file in FIG. 1, and on this mask data file 12, the following processing is performed to divide the full-area mask data file 12 into mask data files 12A and 12B of partial areas specified by the input apparatus 13.

Next, processing in the computer 10 will be described.

A header information reading section 31 reads the full-area header information 18 of FIG. 3 from the mask data file 12.

An area dividing section 32 divides the full area into a plurality of partial areas according to a divisional unit specified by the input apparatus 13 or by means of a uniform division method described later. For example, when 'two partial areas' is specified as a number of the divisional unit, the full-area header information 18 of FIG. 3 is referred, and the full area is divided into a partial area A having area numbers 1 and 2 (two partial areas), and a partial area B having area numbers 3 and 4 (two partial areas).

A partial-area header information producing section 33A extracts information on the partial area A from the full-area header information 18 to produce partial-area header information 18A. A partial-area header information producing section 33B extracts information on the partial area B from the full-area header information 18 to produce partial-area header information 18B1 of FIG. 3.

Figure 5:
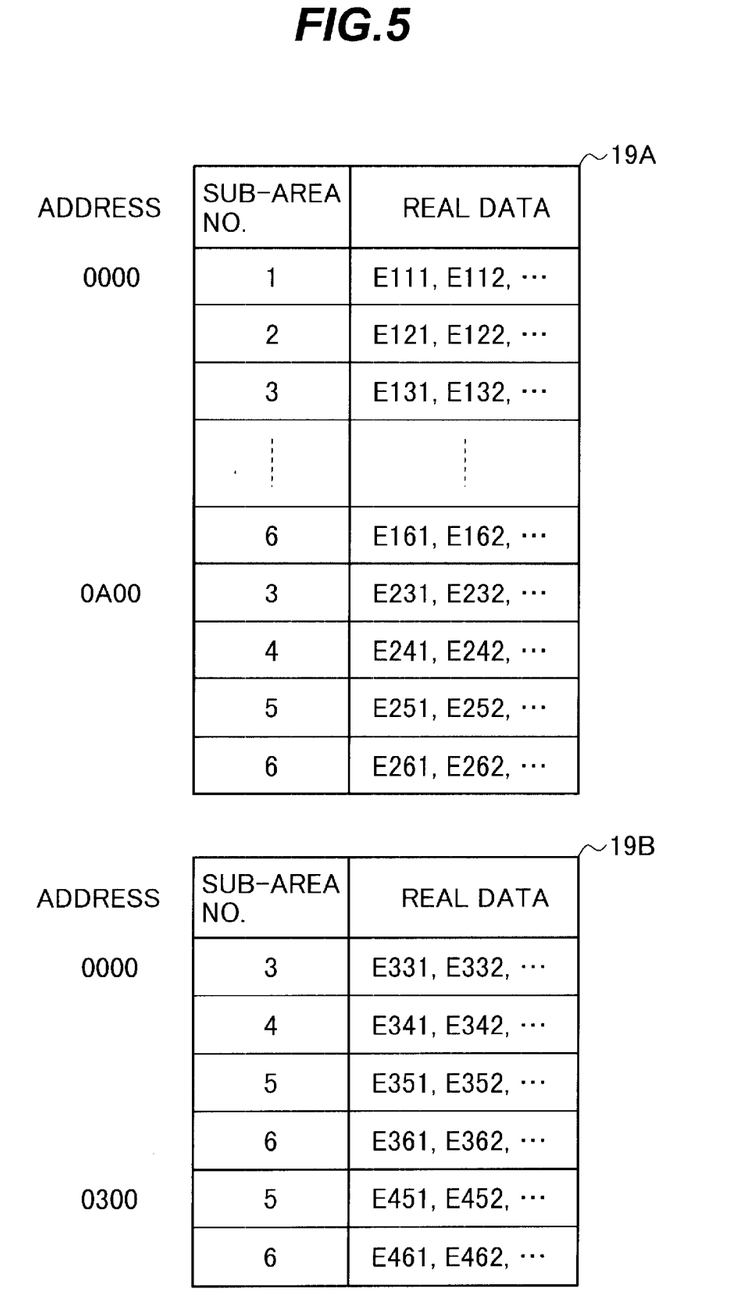
FIG. 5 is an illustration showing real data of partial areas.

A real data extraction section 34A refers to the header information 18A, and extracts real data of the partial area A from real data 19 of the full area of FIG. 4 stored in the mask data file 12. In FIG. 5, a reference character 19A denotes the extracted real data. Likewise, a real data extraction section 34B refers to the header information 18B1, and extracts real data of the partial area B from the real data 19 of the full area.

A data output section 35A outputs a pair of the partial-area header information 18A produced in the processing section 33A and the real data extracted in the processing 34A to produce the partial-area mask data file 12A. A data output section 35B shifts data addresses such that the starting address of the real data extracted at the section 35B coincides with that of the real data 19A, for example, '0000', and this shift is also applied to the header information 18B1 shown in FIG. 3 to change to header information 18B2, and outputs a pair of the header information 18B2 and the shifted real data 19B to produce the partial-area mask data file 12B.

Figure 6A:
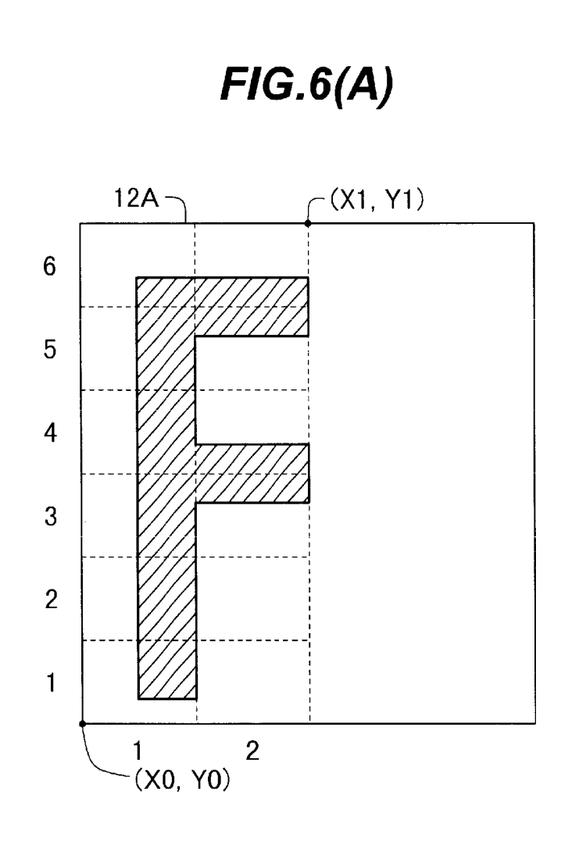
FIGS. 6(A) and 6(B) are illustration s showing mask data files of partial areas A and B of FIG. 1.
Figure 6B:
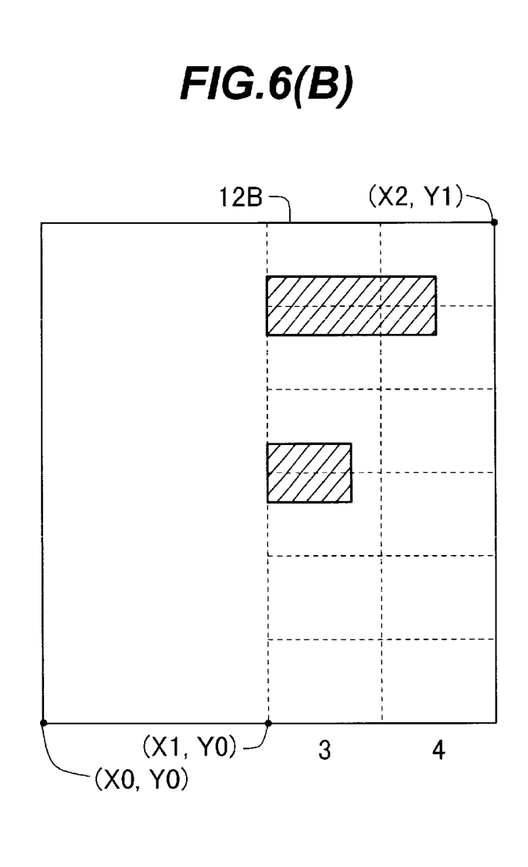

FIGS. 6(A) and 6(B) show images of the mask data files 12A and 12B of partial areas of FIG. 1.

The origin of a coordinate system on a chip for the coordinates of a starting point of each basic figure in the mask data file 12B is the same as that in the mask data file 12A, that is (X0, Y0), which is different from FIG. 11. Hence, synthesis on the exposure system sides and the inspection apparatus sides becomes easy.

In this embodiment, the mask data file 12 is produced from the CAD data file of the full area of a semiconductor integrated circuit, processing can be collectively performed, an efficiency thereof is improved compared with a case where the full area is divided, and in addition to this, the processing of FIG. 1 is simple, resulting in that the sum of times required for producing mask data files of areas obtained by division can be shorter than that in the prior art.

In a case where uniform division is specified by the input apparatus 13, header information is referred at the area dividing section 32 and the full area is divided into partial areas each having an integer number of an unit area in such a way that CAD data amounts of the respective partial areas are about equal to one another. In this case, the number of partial areas may be specified by the input apparatus 13.

Figure 7A:
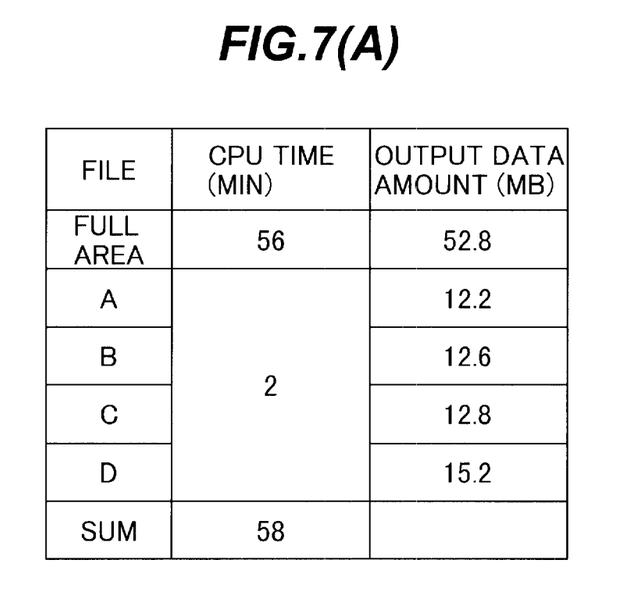
FIGS. 7(A) and 7(B) are tables showing processing results in cases where the full area of a small scale circuit is divided into four partial areas using methods according to the present invention and the prior art, respectively.
Figure 7B:
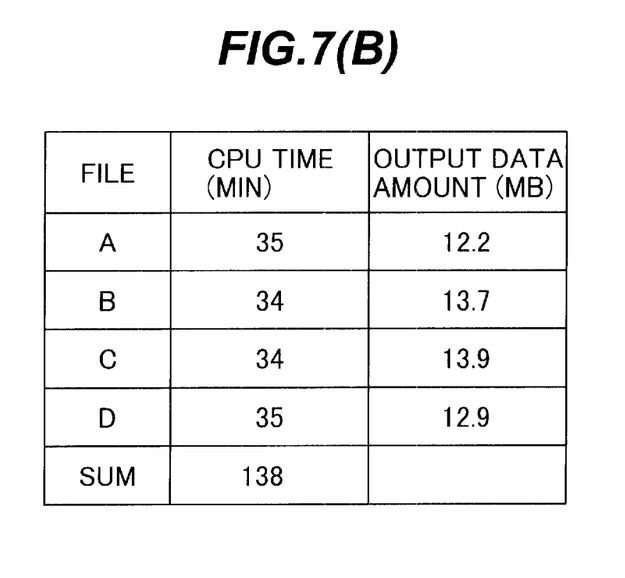

FIGS. 7(A) and 7(B) show results in a case where the full area of a small scale circuit, data amount of whose mask data file 12 is 52.8 Mb, is divided into four ways using a method according to the present invention and the prior art, respectively. It took 56 min as a CPU time in order to produce the mask data file 12 of FIG. 9 on the full area, while by the apparatus of FIG. 1, it took only 2 min as a CPU time to produce the mask data files divided into four ways, resulting in that the sum of times was 58 min. In contrast to this, partial areas A to D were specified by the input apparatus 13 and mask data files 12 were produced for the respective partial areas A to D in FIG. 9, it took 35, 34, 34 and 35 min, respectively, as a CPU time, resulting in that the sum of times was 138 min. Since data amount is far more in a actual large scale circuit than that described above, a difference in CPU time therebetween further increases, thereby making the effect of the present invention remarkable.

After mask data files for a plurality of partial areas are produced, if a combined data amount obtained through merging mask data files each having a small data amount is still lower than an allowable amount on a exposure system side, it will be possible to increase a throughput of an exposure system by the merging.

Figure 8:
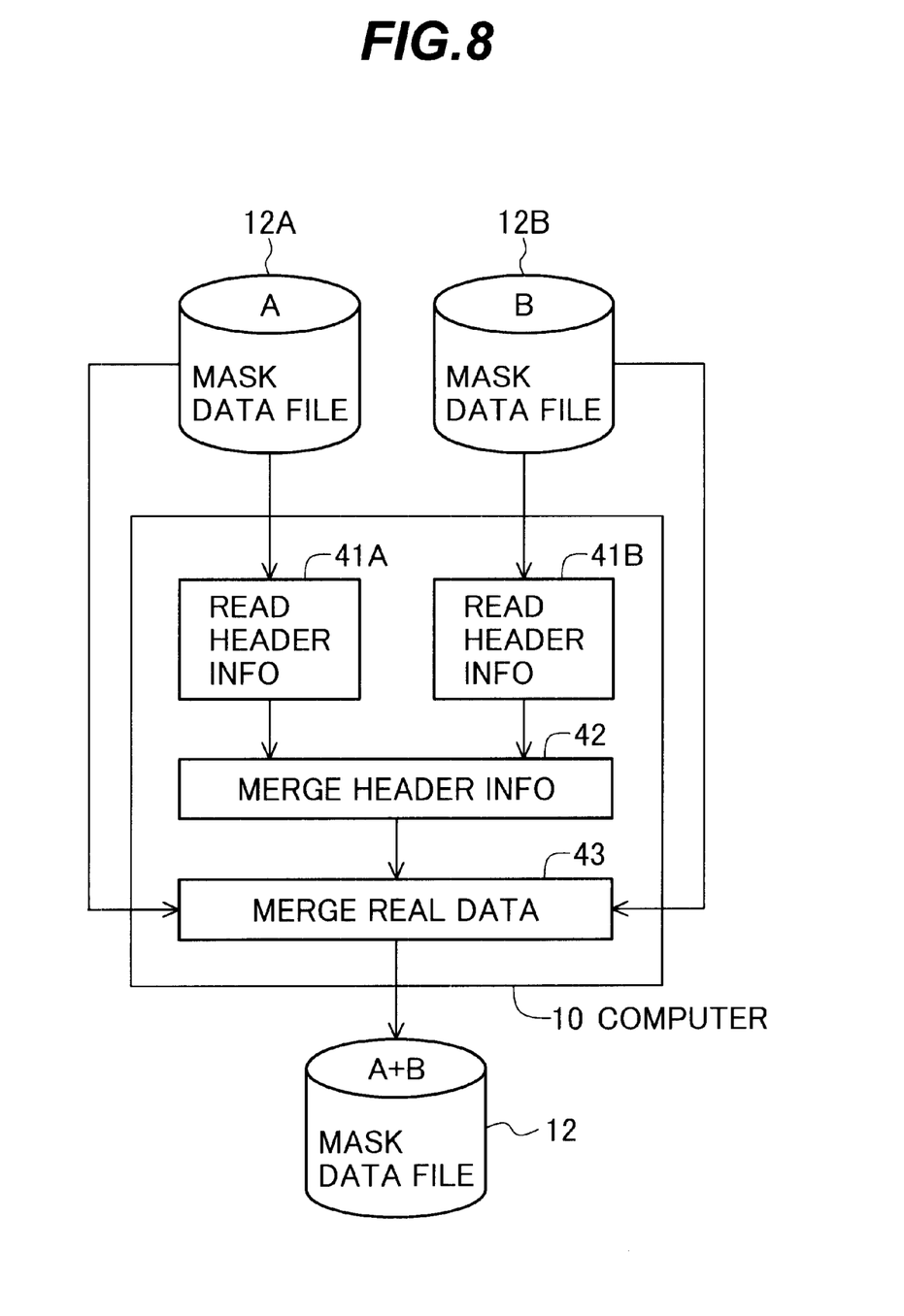
FIG. 8 is a schematic functional block diagram showing an apparatus of merging partial-area mask data files.

FIG. 8 shows an apparatus for merging partial-area mask data files 12A and 12B in such a case. A hardware configuration of this apparatus is the same as in FIG. 1 but only a software configuration is different.

Next, description will be given of operation of functional blocks of the computer 10.

Header information reading sections 41A and 41B read, for example, partial-area header information 18A and 18B2 of FIG. 3 from the mask data files 12A and 12B, respectively.

A header information merging section 42 shifts a starting address of the header information 18B2 by an data amount of the mask data file 12A to change to the header information 18B1, and merges the header information 18B1 with the header information 18A to obtain the full-area header information 18 of FIG. 3.

A real data merging section 43 reads a real data from the mask data file 12A with referring to the header information, reads a real data from the mask data file 12B with shifting addresses by the above described shift amount, merges both data, and stores it into the mask data file 12 together with the header information 18.

Such processing can be performed in a short time, similar to the case of FIG. 1.

Although preferred embodiments of the present invention has been described, it is to be understood that the invention is not limited thereto and that various changes and modifications may be made without departing from the spirit and scope of the invention.

For example, at the header information reading section 31 of FIG. 1, it may be that starting addresses of real data that are identified by sub-area numbers, which are sub-headers of FIG. 4, are also read as header information and an integer times a unit area is specified as a divisional unit by the input apparatus 13. Further, in a case where uniform division is specified by the input apparatus 13, the full area may be divided into partial areas each is a integer times a sub-area unit such that CAD data amounts of the partial areas may be almost equal to one another.

What is claimed is:

1. A method of producing partial-area mask data files for use in a charged particle beam exposure system or an inspection apparatus based on a CAD data of a full area of a semiconductor integrated circuit, said partial-area mask data files being of respective partial areas obtained by dividing said full area, said method comprising:

dividing said full area into a plurality of unit areas;

producing a full-area mask data file based on said CAD data of said full area, and producing full-area header information having mask top data addresses of respective said unit areas and positional information on said unit areas;

producing partial-area header information for each of said partial areas based on said full-area header information; and extracting mask data of each of said partial areas from said full-area mask data file based on said partial-area header information to produce said partial-area mask data file corresponding to said partial-area header information.

2. The method of claim 1, wherein each of said partial areas is an area of an integer times said unit area and determined by a divisional number specified by an operator.

3. The method of claim 1, wherein each of said partial areas is an area of an integer times said unit area and determined based on said full-area header information in such a way that data amounts of said partial-area mask data files are substantially equal to one another.

4. A method of producing mask data files for an integrated circuit, comprising:

dividing a full area into a plurality of unit areas;

producing a full area mask data file based on CAD data of said full area;

dividing said full area in partial areas, each partial area is an area of an integer times said unit area determined by a divisional number; and extracting mask data of each of said partial areas from said full area mask data file based on mask top data addresses of respective said unit areas and positional information on said unit areas to produce a partial area mask data file.

5. A method of producing mask data files for an integrated circuit, comprising:

dividing a full area into a plurality of unit areas;

producing a full area mask data file based on CAD data of said full area;

dividing said full area in partial areas, each partial area is an area of an integer times said unit area determined by a divisional number; and extracting mask data of each of said partial areas from said full area mask data file based on mask top data addresses of respective said unit areas and positional information on said unit areas to produce a partial area mask data file, wherein each of said partial areas is an area of an integer times said unit area and determined based on full area header information so that data amounts of partial area mask data files are substantially equal to one another.

* * * * *